United States Patent [19]

Zdebel et al.

[11] Patent Number: 4,772,566

[45] Date of Patent: Sep. 20, 1988

[54] SINGLE TUB TRANSISTOR MEANS AND METHOD

[75] Inventors: Peter J. Zdebel, Mesa; Bor-Yuan Hwang, Chandler; Allen J. Wagner, Phoenix, all of Ariz.

[73] Assignee: Motorola Inc., Schaumburg, Ill.

[21] Appl. No.: 68,373

[22] Filed: Jul. 1, 1987

[51] Int. Cl.$^4$ .................... H01L 21/225; H01L 21/20
[52] U.S. Cl. ........................ 437/032; 357/34; 357/91; 437/29; 437/31; 437/26; 437/69
[58] Field of Search ................. 437/29, 31, 32, 69, 437/26; 357/34, 91

[56] References Cited

U.S. PATENT DOCUMENTS

| | | | |
|---|---|---|---|
| 4,430,793 | 2/1984 | Hart | 437/31 |
| 4,495,010 | 1/1985 | Kranzer | 437/31 |
| 4,545,114 | 10/1985 | Ito et al. | 437/32 |
| 4,581,319 | 4/1986 | Wieder et al. | 437/31 |
| 4,640,721 | 2/1987 | Uehara et al. | 437/31 |
| 4,641,416 | 2/1987 | Iranmanesh | 437/31 |
| 4,641,419 | 2/1987 | Kudo | 437/31 |
| 4,689,872 | 9/1987 | Appels et al. | 437/31 |

*Primary Examiner*—Upendra Roy
*Attorney, Agent, or Firm*—Robert M. Handy

[57] ABSTRACT

A means and method for forming a single tub transistor, such as for example a vertical NPN bipolar transistor surrounded by an isolation wall, is described. Multiple polysilicon and dielectric layers are employed in conjunction with a master mask and with isotropic and anisotropic etching procedures to define the contacts and active regions of the device without resorting to precision alignments. Sub-micron lateral device contacts are easily achieved even with comparatively coarse lithographic methods through use of sidewall spacers for controlled narrowing of critical device openings. The finished device is especially compact, has low resistance contacts for its size, and provides very high speed operation.

17 Claims, 8 Drawing Sheets

SINGLE TUB TRANSISTOR MEANS AND METHOD

BACKGROUND OF THE INVENTION

The application by Peter Zdebel et al., entitled "Integrated Circuit Structures Having Polycrystalline Electrode Contacts and Process", Ser. No. 07/009,322, is related.

This invention relates generally to a means and method for fabricating an integrated circuit structure, and more particularly, to a means and method for fabricating an integrated transistor in a single crystal semiconductor region enclosed by an isolation wall.

There is a need in the integrated circuit art for obtaining smaller and smaller devices without sacrificing device performance. Small device size requires small device regions, precise alignment between regions and minimization of parasitic resistances and capacitances. Device size can be reduced by putting more reliance on fine line lithography, but as device shrinking continues, it becomes impractical or impossible to continue to reduce feature size and achieve the required greater and greater alignment accuracy. As lithography is pushed to the limit, yield and production throughput decrease. Thus, a need continues to exist for means and methods for manufacturing high performance semiconductor devices, especially transistors, having smaller total area and where the critical device regions have extremely small dimensions and are located with respect to each other without need for critical alignment steps.

Accordingly, it is an object of this invention to provide an improved process and structure for fabricating integrated circuit devices, particularly transistors.

It is another object of this invention to provide an improved process and structure for producing integrated circuit devices, particularly transistors, of reduced size with practicable photolithographic tolerance.

It is yet another object of this invention to provide an improved process and structure for NPN and PNP transistors wherein the device contacts are separated by the minimum lithographic spacing capability.

It is a still further object of this invention to provide an improved process and structure for producing vertical NPN or PNP transistors in a single semiconductor tub, laterally surrounded by an insulating isolation region.

As used herein, the words "block-out mask" are intended to refer to a mask or its corresponding image in various device layers, which provides one or more open regions and closed regions which need not be precisely aligned to preceding fabrication patterns or masks. A block-out mask is typically used to protect openings and/or other areas of the structure created by one or more earlier masks from etching or implantation steps which are for example, intended to proceed through the combination of the open regions of the block-out mask and other openings in earlier masks or layers.

The word "intrinsic" in connection with a base region or the like is used herein to refer to the active portion of the base of a transistor between the emitter and collector or equivalent. The word "extrinsic" in connection with a base region or the like is used herein to refer to the inactive portion of the base or the like, for example, the portion of a bipolar transistor base laterally exterior to the intrinsic base region, and which is typically used to provide contact to the intrinsic base region.

BRIEF SUMMARY OF THE INVENTION

The foregoing and other objects and advantages of the invention are achieved through the improved process for fabricating semiconductor devices and the improved device structures disclosed herein.

In accordance with a preferred embodiment of the invention, a semiconductor substrate is provided and an isolation wall is formed therein which laterally encloses a single crystal portion of the substrate extending to a principle surface. The single crystal portion enclosed by the isolation wall is referred to herein as a "tub" or "island".

The isolation wall may be a dielectric isolation wall or may be a combination of dielectric and other materials, so long as it provides at least a circumferential insulating barrier laterally surrounding the tub or island. The semiconductor material in the tub generally communicates with the semiconductor material of the substrate, but that is not essential. A fully dielectrically isolated tub or island may also be used, i.e., extending beneath the single cryastal region as well as laterally around it. As used herein, the words "tub" or "island" are intended to encompass both arrangements.

In order to reduce the collector series resistance a buried layer region is generally provided within the tub or island.

A first layer of an oxidizable conductive polycrystalline material, for example, polycrystalline silicon, is deposited on the substrate over the exposed surface of the isolation wall and the single crystal semiconductor in the tub or island. The first polycrystalline layer is covered by a layer of an oxidation resistant material, for example, silicon nitride. An oxidizable second polycrystalline layer of, for example, polycrystalline silicon, is deposited over the nitride layer. The second polycrystalline layer is then covered by a layer suitable for masking. Silicon dioxide or organic resist or sandwiches thereof are examples of materials suitable for masking layers. It is convenient during or after deposition of the first polycrystalline layer to dope the upper surface of the first polycrystalline layer with an impurity of a first conductivity type.

A master mask is then used to define openings in the masking layer. The master mask contains openings which define all the critical areas of the device. For example, in the case of a vertical NPN bipolar transistor, the master mask contains openings for defining the collector contact, the emitter and emitter contact, the base and the base contact. This insures that all the critical device regions are laterally self-aligned and that their separation need not be greater than the minimum achievable separation provided by the lithographic technology being used.

In the preferred embodiment, the master mask contains first and second non-overlapping openings located above the semiconductor island or tub, a third opening laterally outside the island, for example, over the isolation wall, and a fourth opening outside the island which laterally encloses the first three openings. Where a bipolar transistor is being formed for example, one of the first or second openings define the collector contact, the other defines the base, emitter and emitter contact, the third opening defines the base contact, and the fourth opening is used in the process to isolate the base contact layer of one transistor from those of adjacent transistors.

Using the master mask, openings are provided which extend through the oxidizable second polycrystalline layer to the first oxidation resistance layer above the first oxidizable conductive polycrystalline layer.

A first block-out mask is then applied which covers the first through third openings created by the master mask, leaving the fourth opening exposed. The portion of the first oxidation resistant layer beneath the combination of the first block-out mask and the fourth opening in the master mask is then removed.

The portion of the first polycrystalline layer exposed as a result of this step and the portions of the secon polycrystalline layer remaining after the preceding step are then converted to a dielectric. This is conveniently accomplished by thermal oxidation of the exposed portions of the first and second polycrystalline layers. The portion of the first polycrystalline layer laterally enclosed by the fourth master mask opening remains unaffected.

The portions of the first oxidation resistant layer exposed in the first through third openings created by the master mask are then removed exposing underlying respective portions of the first polycrystalline layer. A second block-out mask is applied covering the portion of the first polycrystalline layer underlying the third master mask opening. The portions of the first polycrystalline layer exposed under the first and second openings of the master mask are then removed. This exposes the underlying portions of the semiconductor island or tub and the sidewalls of the first polycrystalline layer facing into the holes created in the first polycrystalline layer. The exposed sidewalls and the exposed surface of the island or tub below the first and second master mask openings are then covered by a thin dielectric layer. This is conveniently accomplished by a light thermal oxidation.

A third block-out mask is applied having an opening exposing the region under the first master mask opening. A dopant is applied through the combination of the first master mask opening and the opening in the third block-out mask. This is conveniently accomplished by ion implantation. Where the first master mask opening is being used for the collector contact, the dopant applied should be of a type suitable to enhance the conduction of the underlying region of the single crystal semiconductor island or tub so as to facilitate a contact thereto. The third block-out mask covers the region underlying the second and third master mask openings.

A fourth block-out mask is then applied which covers the region underlying the first master mask opening but exposes the regions underlying the second and third master mask openings. A dopant is then introduced, for example by ion implantion, into the portion of the tub underlying the second master mask opening and, desirably, also into the portion of the first polycrystalline layer underlying the third master mask opening. Where a bipolar transistor is being formed, this dopant is conveniently of the type appropriate for the intrinsic base region of the transistor and the same type as for the extrinsic base region. The extrinsic base region of the transistor is conveniently formed by out-diffusion of dopant previously provided in the first polycrystalline layer.

A thin dielectric layer is conformally applied over the structure followed by a conductive third polycrystalline layer. An anisotropic etching procedure is conveniently used to remove the third polycrystalline layer except on the sidewalls of the first three openings created by master mask. This procedure also exposes the oxide on the semiconductor material underlying the first three master mask openings. A brief etch is conveniently used to remove this oxide so that the single crystal semiconductor surfaces of the island is exposed under the first and second openings and the surface of the first polycrystalline layer is exposed under the third opening.

A conductive fourth polycrystalline layer of for example, polycrystalline silicon is then applied over the structure so as to contact the portions of the semiconductor island exposed beneath the first and second master mask openings and to contact the portion of the first polycrystalline layer exposed under the third master mask opening.

A further block-out mask is applied which covers the regions underlying the first and second master mask openings and which exposes the region underlying the third master mask opening. This is used to etch away the portion of the fourth polycrystalline layer underlying the third master mask opening. At the same time if desired, the same etching step may be used to electrically separate the portions of the fourth polycrystalline layer in contact with the semiconductor island or through the openings produced by the first and second master mask openings. This provides electrical separation between the collector contact and the emitter contact of the device. However, this may be accomplished later.

The fourth polycrystalline layer is conveniently doped and the dopant therein driven into the underlying portions of the single crystal semiconductor tub. This provides an enhanced collector contact in addition to the collector contact enhancement provided earlier in the process, and provides a highly doped emitter region, self-aligned with the base and formed through the same master mask opening as the intrinsic base, but of smaller lateral dimension. The narrowing of the lateral dimensions of the emitter region as compared to the intrinsic base region is accomplished by the sidewall spacers formed from the thin oxide and the third polycrystalline layer which are deposited earlier in the process and then subjected to anisotropic etching.

To finish the device, a metallization or other conductor layer is provided over the remaining portions of the fourth polycrystalline layer and, using etching techniques well-known in the art patterned to provide a first portion in contact with the portion of the fourth polycrystalline layer contacting the collector, a second portion in contact with the portion of the fourth polycrystalline layer contacting the emitter, and a third portion in contact with the portion of the first polycrystalline layer which serves as a lead to the extrinsic base regions adjacent the second mask opening.

Polycrystalline silicon is a suitable material for the first through fourth polycrystalline layers. However, other materials, such as intermetallics may also be used. It is important that the first polycrystalline layer be both conductive and oxidizable. It is desirable that the second polycrystalline layer be oxidizable. It is important that the first polycrystalline layer be able to act as a dopant source to form the extrinsic base region. It is important that the fourth polycrystalline layer be conductive and also be able to act as a dopant source for the emitter and collector contact.

It is convenient to provide, preceding the deposition of the first polycrystalline layer, an oxidation and dopant resistant under-layer on the substrate overlying the isolation wall. Silicon nitride and silicon oxide-silicon nitride mixtures or sandwiches are examples of suitable materials for this under-layer. This under-layer acts to prevent the diffusion of impurities from the surface of the device through the various layers which have been deposited thereon into the isolation walls surrounding the single crystal tub or island.

While this under-layer of oxidation and diffusion resistance material may extend partially on the single crystal island or tub, it should not extend everywhere between the first polycrystalline layer and island or tub since, out-diffusion from the first polycrystalline layer into the semiconductor island or tub is the most convenient means for providing the extrinsic base region which is used in combination with the first polycrystalline layer to make contact to the intrinsic base region of the device.

In a further embodiment, a portion of the under-layer is provided in the space between the first and second master mask openings. This prevents the extrinsic base, formed by diffusion from the first polycrystalline layer, from contacting the highly doped collector contact region and improves the breakdown voltage of the device.

DETAILED DESCRIPTION OF THE PREFERRED EMBODIMENTS

The invented process and arrangement of layers and regions are useful for forming a wide variety of device types and structures having utility as individual devices or in combination. In order to facilitate an understanding of the present invention, a process and arrangement for forming a vertical bipolar transistor, particularly a vertical NPN transistor on a P-type substrate is described. Silicon is the preferred single crystal semiconductor substrate in which the device is constructed, but other semiconductor materials well-known in the art may also be used. Those of skill in the art will understand, based upon the descriptions presented herein that the particular device examples and materials described are chosen to facilitate understanding of the invention and are not intended to be limiting or infer that the invented process or arrangement is useful only for the exemplary devices. Those of skill in the art will appreciate that the invented processes and arrangements are applicable to other types of devices and structures in addition to those particularly illustrated herein.

The formation of a single tub vertical NPN bipolar transistor on a P-type substrate is described. Those of skill in the art will appreciate that a vertical PNP on an N-type substrate may be formed by reversing the choice of conductivity types. Vertical bipolar transistors are much used in the integrated circuit art. Accordingly, improved means and methods for their formation have great utility and importance, particularly where extremely compact devices are obtained.

Figure 1:
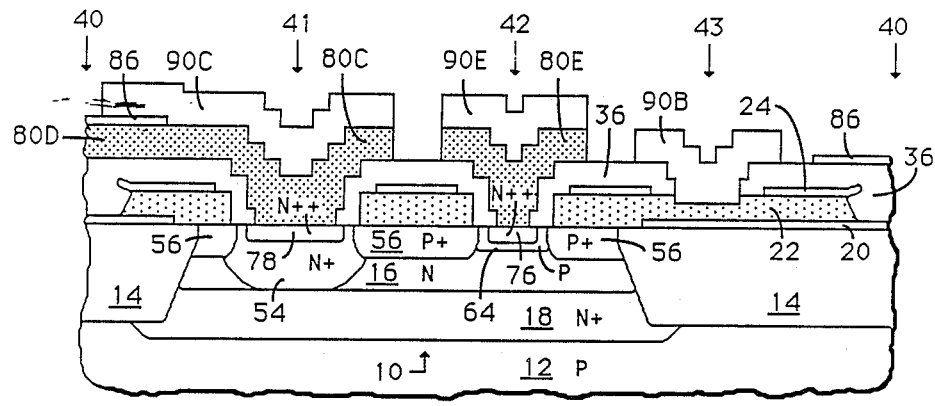
FIGS. 1 and 2 illustrate, in schematic cross-sectional and top view, respectively, a vertical NPN transistor fabricated in accordance with the invention.

FIG. 1 illustrates a schematic cross-sectional view of portion 8 of a semiconductor substrate in which a vertical NPN transistor has been formed according to the present invention.

Figure 2:
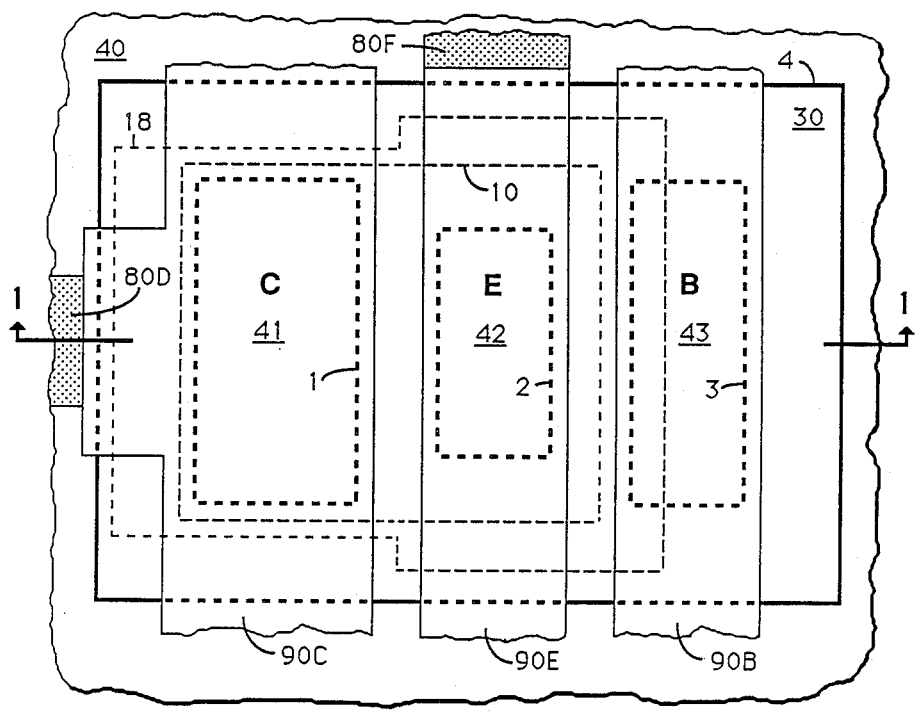

FIG. 2 illustrates, in plan view, the top surface of the transistor of FIG. 1, showing the overlay of several of the process masks utilized to achieve the completed device. Vertical bipolar transistor 8 is located in single crystal region 10 formed on single crystal semiconductor substrate 12 and laterally surrounded by dielectric or other insulating isolation region 14. Single crystal region 10 surrounded by isolation region 14 is referred to in the art as a semiconductor "island" or "tub". NPN vertical transistor 8 is fabricated within single tub or island 10. It is not necessary to provide a second isolated semiconductor island or tub to receive, for example, the collector or base contact. With the invented structure and method the collector and emitter contacts are provided in the same semiconductor island and the base contact is provided above the adjacent isolation wall. Accordingly, device 8 is referred to as a single tub or single island device. Construction of a vertical bipolar transistor using two tubs is described in copending application by Peter Zdebel et al., entitled "Integrated Circuit Structures Having Polycrystalline Electrode Contacts and Process", Ser. No. 07/009,322, which is incorporated herein by reference.

Tub or island 10 is conveniently formed on P-type substrate 12 and comprises N+ buried collector region 18 surmounted by N-type collector region 16. Also located within tub 10 are N++ and N+ collector contact diffusions 78 and 54, P-type intrinsic base region 64, N++ emitter region 76, and P+ extrinsic base region 56. Polycrystalline conductor 80C covered by conductor 90C makes contact to N++ collector contact diffusion 78. Polycrystalline conductor 80E covered by conductor 90E makes contact to N++ emitter region 76. Conductor 90B provides contact to poly conductor 22 for the base contact. Conductors 90C, 90E, and 90B are preferably of metal, but other highly conductive materials may also be used, for example, intermetallics and semi-metals. Conductors 90C and 90E are arranged to completely or partially cover polycrystalline conductors 80C and 80E respectively. Portions of the polycrystalline conductors may be left exposed, i.e., not covered by metal, to serve as series resistors. This arrangement is illustrated in FIG. 2 wherein portions 80D and 80F of the polycrystalline conductor 80C and 80E respectively are not covered by overlying conductors 90C and 90E.

Polycrystalline conductor 22 is electrical isolated from polycrystalline conductors 80C, 80E by dielectric regions 24, 36. Dielectric under-layer 20 is conveniently provided between isolation wall or region 14 and polycrystalline conductor 22 so as to prevent interdiffusion therebetween. Dielectric layer 86 is conveniently provided above dielectric 36 and polycrystalline conductor 80C, 80D as a passivation layer. The composition and makeup of the device illustrated in FIGS. 1-2 will be more fully understood in terms of the process description which follows.

Figure 18:
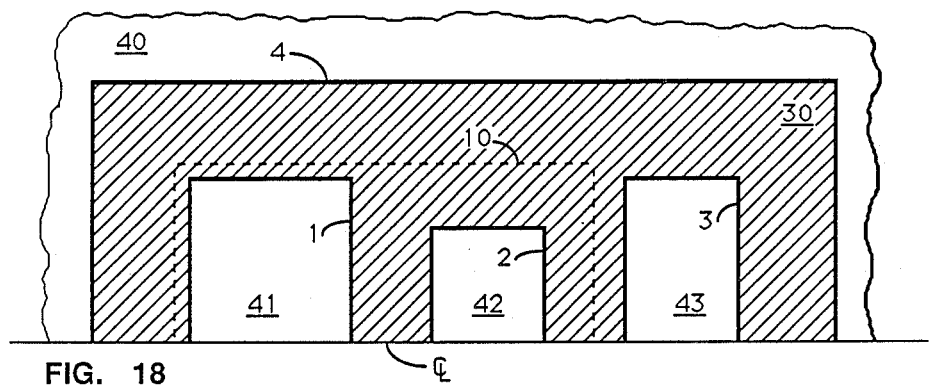
FIGS. 18 through 24 are partial schematic top views, similar to the upper half of FIG. 2, of the transistor of FIGS. 1-2 showing the different masks used at various stages of fabrication. The shaded regions of FIGS. 18-24 indicate the covering or closed protective portions of the various masks. The image of the mask of FIG. 18 is shown in FIGS. 19-24 so that the relative position of the masks may be understood.

FIGS. 3-16 illustrate the device of FIGS. 1-2 in schematic cross-section at various stages of fabrication. FIGS. 18-24 illustrate plan views of the masks used during fabrication. The shaded areas represent the covering, i.e., closed protective portions of the masks. The master mask image of FIG. 18 is superimposed on the block-out mask images of FIGS. 19-24 so that the relative placement of the various openings may be seen.

Figure 3:
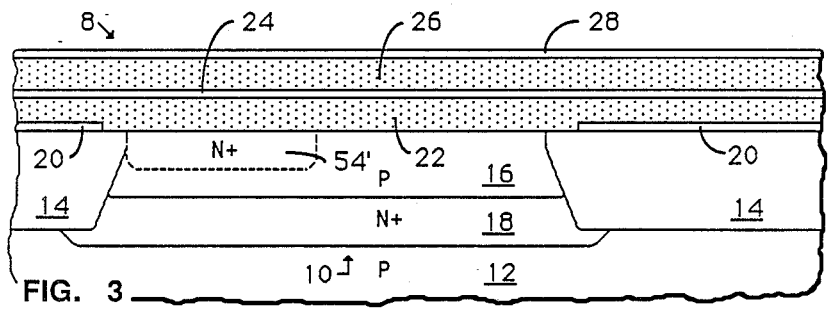
FIGS. 3 through 16 are schematic cross-sectional views similar to that of FIG. 1 showing the transistor of FIGS. 1-2 at various stages of fabrication.

In FIG. 3, P-type substrate 12 containing tub 10 within lateral isolation wall 14 and having N+ buried collector 18 and N-type collector region 16 is provided. Regions 14, 16, and 18 are formed by means well-known in the art using conventional techniques. Optionally, at this stage of the process, N+ deep collector contact enhancement diffusion 54' may be provided, also by means well-known in the art. In the description which follows, it is assumed that N+ collector contact enhancement diffusion is provided at a later stage of the process. However, those of skill in the art will understand that this deep collector contact region may be provided before or after the stage of fabrication illustrated in FIG. 3.

The structure illustrated in FIG. 3 comprising substrate 12, insulating isolation region 14 of, for example, silicon dioxide, and subcollector 18 in collector region 16, is desirably covered by under-layer 20 which is masked and etched to provide an opening encompassing tub 10. Under-layer 20 is desirably of a material which inhibits diffusion, such as for example, silicon nitride or silicon oxide-silicon nitride sandwiches or mixtures. However, other diffusion inhibiting materials may also be used. Under-layer 20 is conveniently formed of a sandwich construction in which the lower portion is a layer of silicon dioxide, for example, having a thickness of about 50 nanometers surmounted by a silicon nitride layer of, for example, about 70 nanometers thickness. Layer 20 is formed by conventional techniques well known in the art. Layer 20 is desirabl since it prevents diffusion from overlying layers into dielectric region 14 and further oxidation of region 14 or substrate 12 underlying region 14 during subsequent process steps. However, it is not essential and may be omitted.

Under-layer 20 and the exposed portions of tub 10 and isolation wall 14 are then covered with first conductive polycrystalline layer 22. Polycrystalline silicon, doped polycrystalline silicon, silicides, and other intermetallic compounds are examples of materials suitable for layer 22. It is desirable that layer 22 also be oxidizable to form a dielectric oxide since, as will be subsequently explained, this is particularly desirable from a fabrication point of view. It is convenient to dope layer 22 by ion implantation after it is deposited, preferably after deposition of dielectric layer 24. Where an NPN device is being formed, boron is a convenient P-type dopant for layer 22. Other dopants may also be used.

First polycrystalline conductor layer 22 is covered by oxidation resistant dielectric layer 24 of, for example, silicon nitride. Layer 24 is in turn covered by polycrystalline layer 26 and further dielectric layer 28. Polycrystalline layer 26 is conveniently formed of polycrystalline silicon. It need not be doped. Other semiconductor or intermetallic materials may also be used for layer 26. It is desirable that layer 26 be of a material which may be converted by chemical processing to form a dielectric, e.g., an oxide or nitride or the like, since, as will be subsequently explained, this is particularly convenient for fabrication.

Dielectric layer 28 will serve as a masking layer for the subsequent etching of underlying layers. Silicon dioxide is an example of a suitable material for layer 28.

The following are examples of the thicknesses of layers 20-28 which have been found to be useful for the fabrication of devices; layer 20 50 to 80 nanometers, layer 22 370 to 400 nanometers, layer 24 90 to 110 nanometers, layer 26 160 to 200 nanometers, and layer 28 20 to 50 nanometers, with about 70, 385, 100, 180, and 40 nanometers, respectively, being convenient. It is desirable that layers 22, 24, and 26 have particular ratios of thicknesses. This is explained more fully later.

Figure 4:
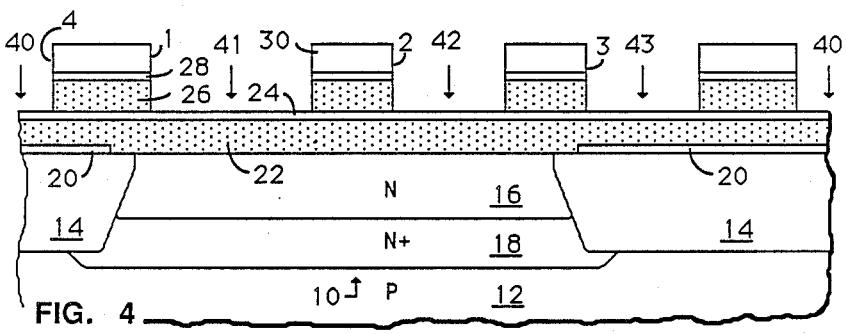

The structure of FIG. 4 is then covered by mask 30 of, for example, photoresist having openings 40, 41, 42 and 43. Mask 30 is referred to herein as the master mask since it contains the openings which determine the critical lateral device dimensions and locate all of the device contacts. The shape of master mask 30 may be understood in cross-section in FIG. 4 and in plan view of FIGS. 2 and 18. Master mask 30 is shown in FIG. 2 by the heavy solid and dashed lines and in FIG. 18 by the heavy solid lines and shaded area. The location of single crystal semiconductor tub or island 10 is shown by the lighter dashed line.

Master mask 30 has opening 40 exterior to perimeter 4, opening 41 interior to perimeter 1, opening 42 interior to perimeter 2 and opening 43 interior to perimeter 3. Perimeter 4 of opening 40 surrounds openings 41, 42, 43. The closed region of mask 30 lies between openings 41, 42, 43 and perimeter 4 of opening 40. For convenience of explanation, the numbers 40, 41, 42, 43 are used to refer not only to the openings in mask 30 but also the openings in the underlying layers derived respectively from these openings in master mask 30. Openings 40-43 are also shown in FIGS. 19-24 so that the location of the openings in the various block-out masks may be related to the openings in the master mask.

Using master mask 30, those portions of layers 26, 28 underlying openings 40-43 are removed to expose underlying portions of layer 24. The resulting structure is illustrated in FIG. 4.

Figure 5:
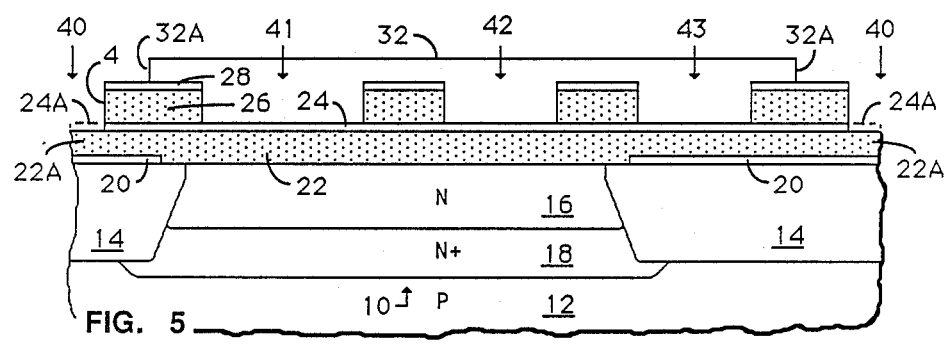
Figure 19:
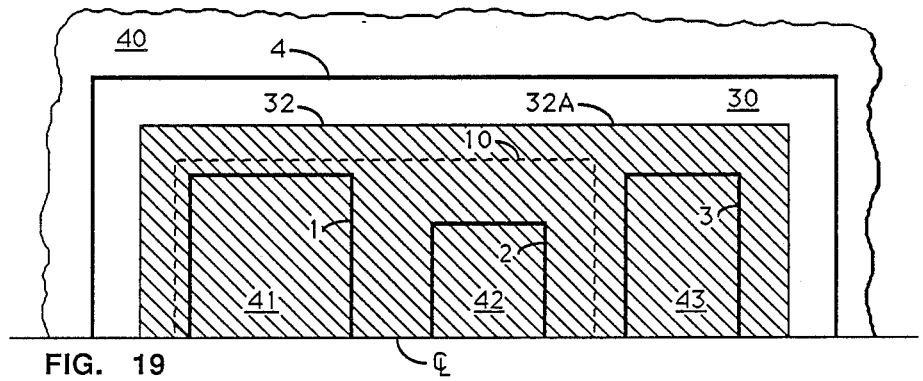

First block-out mask 32 having perimeter 32A is then applied as shown in FIGS. 5 and 19. Photoresist is a convenient material for first block-out mask 32. Using the combination of first block-out mask 32 and opening 40 in master mask 30, portion 24A of layer 24 exterior to perimeter 4 of opening 40 of block-out mask 30 is removed (see FIG. 5), to expose underlying portion 22A of polycrystalline layer 22. Block-out mask 32 is then removed.

Figure 6:
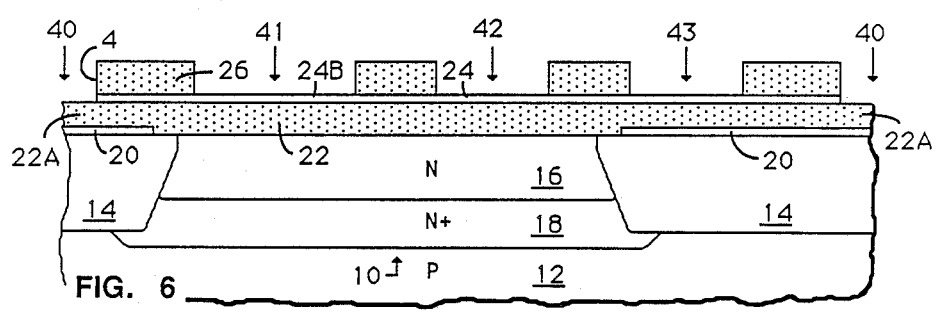

The remaining portions of layer 28 are conveniently removed without use of further masks, as for example, by a simple dip etch procedure. The result is shown in FIG. 6. It will be noted that portions 24B of layer 24 still cover the portions of polycrystalline layer underlying openings 41, 42, 43, while portion 22A underlying opening 40 is exposed.

Figure 7:
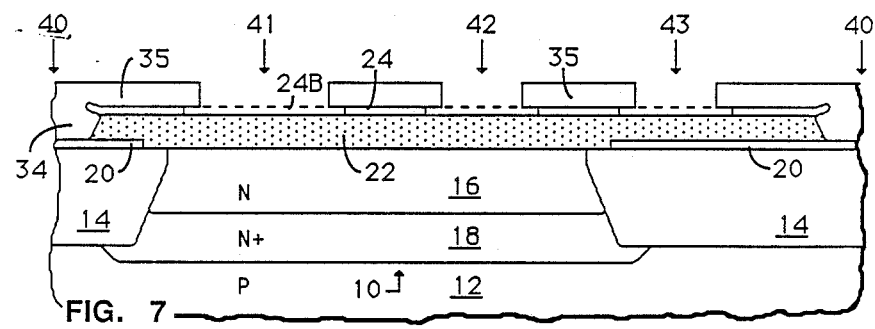

The structure of FIG. 6 is then conveniently oxidized to convert the remaining portions of polycrystalline layer 26 and exposed portion 22A of polycrystalline layer 22 to a dielectric, for example, silicon dioxide. The result is illustrated in FIG. 7. Conversion of the remaining portions of layer 26 produces oxide region 35 and conversion of exposed portion 22A of layer 22 produces oxide region 34 which joins smoothly with oxide region 35. For convenience, oxide regions 34, 35 are hereafter collectively referred to by the number 36.

The oxidation of polycrystalline layer 26 and exposed portion 22A of layer 22 is preferably done using a relatively low temperature, high pressure oxidation process to minimize the total amount of time the structure is exposed to elevated temperatures. Use of high pressure results in comparatively rapid oxidation at relatively low temperatures. For example, when layers 22 and 26 are of polycrystalline silicon, conversion of the desired portions of these layers to silicon dioxide can be accomplished at temperatures as low as 750° C. in a reasonable time at pressures of about 25 atmospheres in oxygen. Other temperatures and pressures may be used, but limiting the time at elevated temperatures is important to prevent excessive redistribution of dopant provided in layer 22. It is desired that dopant provided in layer 22 does not substantially diffuse into single crystal region 16 at this time.

During the oxidation step, polycrystalline region 22A and the remaining parts of layer 26 are oxidized simultaneously. Layer 22 is oxidized only in region 22A beneath opening 40 outside master mask 30 where portion 24A of oxidation resistant layer 24 has been removed. The remaining part of oxidation resistant layer 24 under openings 41, 42, 43 protects the remainder of polycrystalline layer 22 over what will become the active transistor area. The oxidation step is self-limiting with respect to polycrystalline layer 26 since it terminates when the oxidation front reaches underlying oxidation resistant layer 24. The oxidation of exposed portion 22A of polycrystalline layer 22 is also self-limiting and substantially stops when the entire thickness of portion 22A of polycrystalline layer 22 is consumed by the oxidation and the oxidation front reaches either under-layer 20, if present, or underlying isolation dielectric 14. Although this oxidation process has been described in terms of a single oxidation of the two polycrystalline layers, i.e., layer 26 and portion 22A of layer 22, the two layers could be oxidized separately by first oxidizing the remaining portions of layer 26, then removing portion 24A of oxidation resistant layer 24 and subsequently oxidizing portion 22A of polycrystalline layer 22.

The above described oxidation of parts of polycrystalline layers 22 and 26 is designed, in accordance with the invention to provide a substantially planar or at least smoothly joined upper surface. Where polycrystalline layer 22 and 26 are of silicon, for example, conversion of portions of these layers to silicon dioxide by oxidation, causes an increase in the volume occupied. For example, silicon dioxide occupies approximately 2.2 times the volume occupied by the silicon from which the oxide is derived. This increase in volume is taken into account of selecting the thickness of the various layers so that the resulting surface is smooth and substantially planar. The thickness of polycrystalline layers 22 and 26 and oxidation resistant layer 24 are selected so that, after oxidation, the thickness of oxide 34 formed from polycrystalline region 22A is about equal to the combined thickness of oxide 35, formed from polycrystalline layer 26, plus the thickness of oxidation resistant layer 24, plus the remaining (unoxidized) portion of polycrystalline layer 22. The resultant surface, except for a minor discontinuity at the intersection between oxide 34 and 35, is substantially smooth and planar. Although specific thicknesses or thickness ranges have been indicated in this preferred embodiment for layers 22, 24, 26, other thicknesses of these layers having the relationship described above can also be utilized.

During the oxidation of poly layer 26, openings 41, 42, 43 are narrowed because of the increase in volume resulting from the conversion of the remaining portions of layer 26 around openings 41, 42, 43 to silicon dioxide. Since the oxide encroaches from both sides of the openings, the reduction in width of the openings is equal to about twice the increase of thickness resulting from the conversion of polycrystalline material to oxide. The reduction in feature size is controlled by a well defined and self-limiting process which depends only upon control of the thickness of deposited polycrystalline layer 26 and the volume change associated with the conversion to oxide. Means for accurately controlling the thickness of deposited polycrystalline layers, whether of polycrystalline silicon or silicides, or other intermetallics are well-known in the art and the volume change on conversion to a dielectric (whether an oxide, nitride or other insulating compound) is fixed for the chemical reaction being carried out. This is a first step in accordance with the invention in reducing the feature size below that produced merely by the photolithographic process. This is an example of how features smaller than those conveniently resolvable by the photolithographic process itself may be obtained reliably and reproducibility by the present process and structure.

Figure 8:
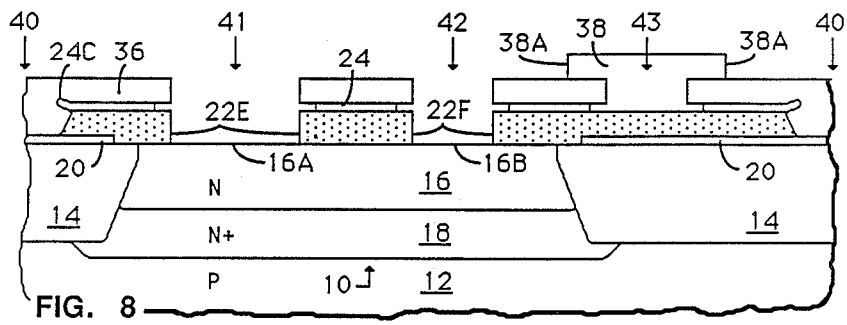
Figure 20:
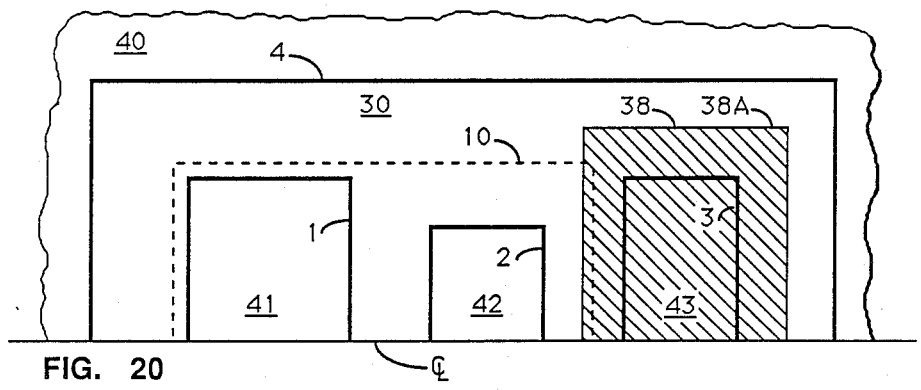

Following formation of oxide region 36, portions 24B of layer 24 exposed in openings 41, 42, 43 are removed so as to uncover the underlying portions of polycrystalline layer 22. This is shown in FIG. 7. Second block-out mask 38 having outside perimeter 38A is then applied to cover the portion of layer 22 exposed under opening 43. This is illustrated in FIGS. 8 and 20. Using the combination of second block-out mask 38 and openings 41, 42 derived from master mask 30, the portions of polycrystalline layer 22 exposed under openings 41, 42 are removed, thereby exposing underlying portions of single crystal region 16 of tub or island 10. The result is shown in FIG. 8. It will be noted that this step exposes sidewalls 22E, 22F of polycrystalline layer 22 under openings 41, 42.

Figure 9:
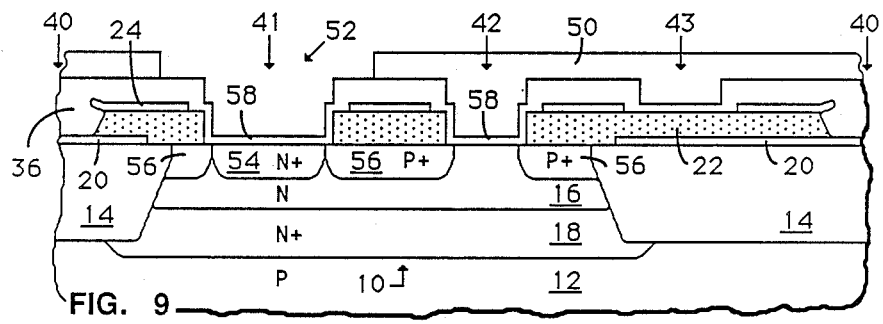

Exposed sidewalls 22E, 22F of polycrystalline layer 22 and exposed surface of 16A, 16B of single crystal region 16 are then covered by oxide 58 (see FIG. 9). This is conveniently accomplished by thermal oxidation although other techniques well-known in the art may also be used. The thickness of oxide 58 is typically in the range 30 to 50 nanometers, with about 40 nanometers being typical.

Figure 21:
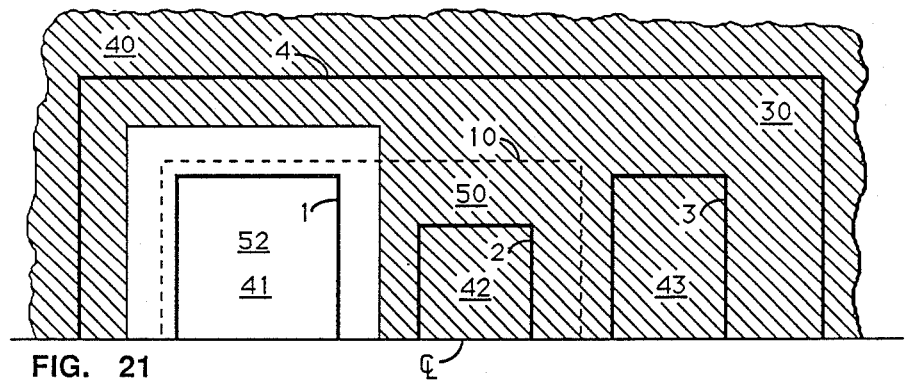
Figure 22:
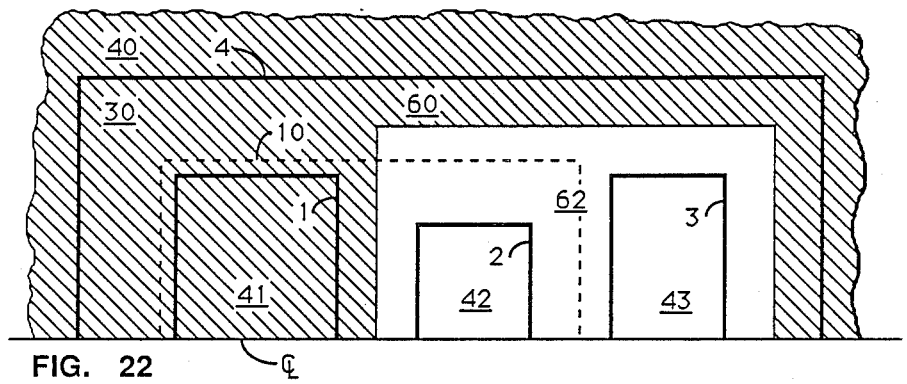

As illustrated in FIGS. 9 and 21, third block-out mask 50 having opening 52 is then applied to the structure. Block-out mask 50 is intended to cover openings 42 and 43 to prevent doping therein. It is immaterial whether block-out mask 50 covers opening 40 or not. Using the combination of block-out mask 50 and opening 41 from master mask 30, N+ region 54 is formed in single crystal region 16 of tub 10. This is conveniently accomplished by ion implantation through oxide 58, but other doping techniques may also be used. P+ region 56 is also formed in single crystal region 16 of tub 10 by out-diffusion of P-type dopant from polycrystalline layer 22. This is readily accomplished by heating the structure to a temperature sufficient to increase the mobility of the dopant previously provided in layer 22 so that it will diffuse the desired distance into single crystal region 16 to form doped region 56. This may be conveniently accomplished during the same heating step used to produce oxide 58 and/or to anneal the implant associated with region 54, or may be performed before or after formation of region 54. Thus, N+ region 54 and P+ region 56 in single crystal region 16 may be formed in either order. The result is illustrated in FIG. 9.

Figure 10:
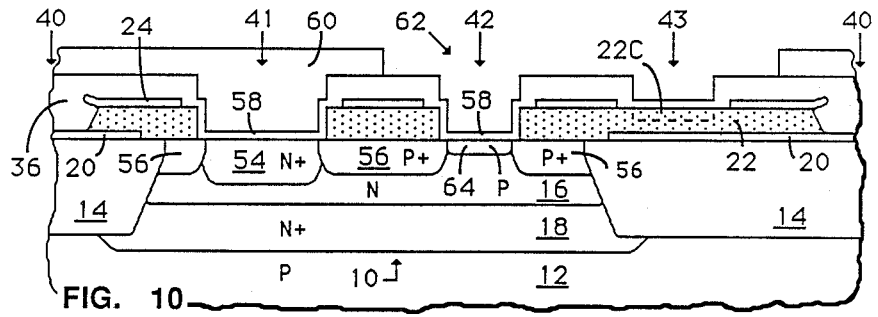

FIG. 10 illustrates the use of fourth block-out mask 60 (see FIG. 22) having opening 62 in order to provide active base region 64 under opening 42 and, conveniently, a contact enhancement doping in region 22C of layer 22 under opening 43. Using the combination of opening 62 in block-out mask 60 and openings 42, 43 derived from master mask 30, P region 64 is conveniently implanted in single crystal region 16 and contact enhancement doped region 22C is implanted under opening 43 and layer 22. While contact enhancement doped region 22C is desired it is not essential, and opening 62 of block-out mask 60 may enclose only the perimeter of opening 42. Block-out mask 60 covers opening 41 so as to prevent the introduction of P-type dopant into N+ region 54. P doped region 64 conveniently serves as the active base for the NPN transistor. As those of skill in the art will appreciate, P doped region 64 may be formed before or after formation of doped regions 54, 56. Thus, the masking steps of FIGS. 9 and 10 may be interchanged in order. However, it is most convenient to form active base region 64 after formation of N+ contact region 54 and P+ extrinsic base region 56. In this way, the high temperature anneal necessary to activate the implanted dopant in region 64 allows the N+ dopant in region 54 to migrate deeper into single crystal region 16. This reduces the series collector resistance. Region 54 will progress deeper into the structure with each subsequent heating step so as to desirably contact buried collector 18.

Following formation of doped regions 54, 56 and 64, conformal dielectric layer 66 is desirably added to the structure. Silicon dioxide is a convenient material for layer 66. Thicknesses in the range 100 to 200 nanometers are convenient with about 150 nanometers being preferred for layer 66. Means for depositing silicon dioxide layers of these thickness ranges are well-known in the art. The result is depicted in FIG. 11.

Figure 11:
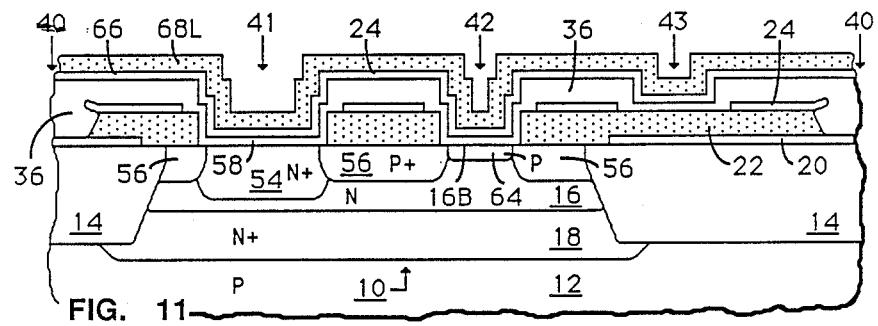
Figure 12:
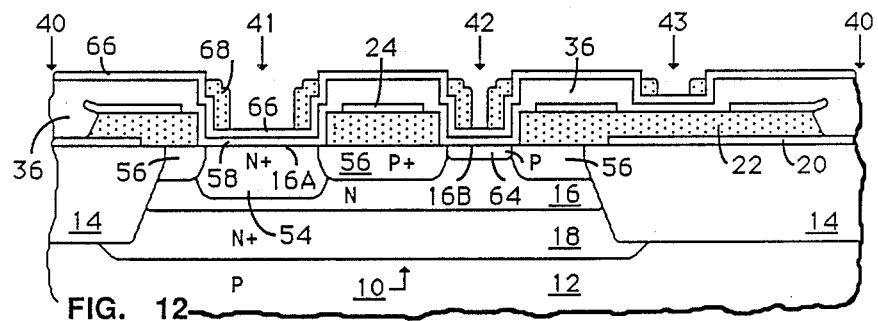

Layer 66 is then covered by third conductive polycrystalline layer 68L as shown in FIG. 11. Layer 68L is conveniently about 200 to 300 nanometers thick with about 250 nanometers being useful. Polycrystalline silicon is convenient for layer 68L, but other polycrystalline conductive materials may also be used.

It is desirable that layer 68L be deposited in a conformal fashion. Then, without any separate masking steps, anisotropic etching is utilized to remove those portions of layer 68L lying on the approximately horizontal surfaces of the structure, leaving behind portions of 68 of layer 68L on the sidewalls of openings 41, 42, 43 (see FIG. 12).

The exposed portions of layer 66 are then etched away. The underlying portions of dielectric 58 exposed in openings 41, 42, 43 are also removed (see FIG. 13). Portions 67 of layer 66 which are protected by regions 68 of third polycrystalline layer 68L which remain on the sidewalls of openings 41, 42, 43. These are indicated by the dashed lines. For convenience dielectric regions 67 are henceforth referred to collectively as part of dielectric region 36.

Figure 13:
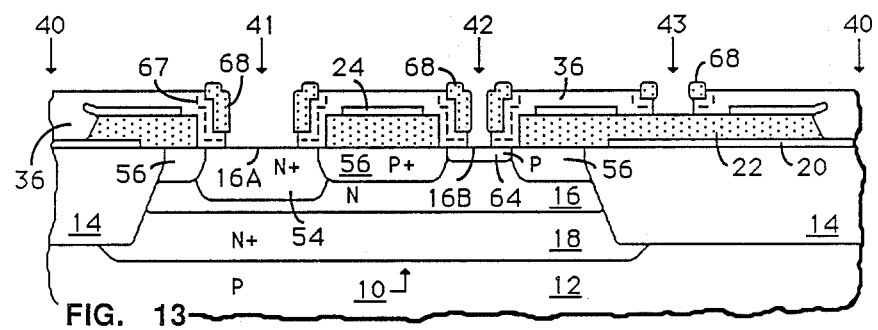

As illustrated in FIG. 13, the foregoing processes re-exposes portions 16A and 16B of the surface of single crystal region 16 under openings 41, 42. However, as those of skill in the art will appreciate from FIG. 13, the lateral dimensions of exposed portion 16A, 16B have been reduced by twice the thickness of dielectric 67 and polycrystalline region 68.

The procedure used for etching dielectric layers 58 and 66 may be isotropic or anisotropic. If an isotropic method is used there is a slight undercutting of dielectrics 58 and 66 beneath poly region 68, as indicated in FIG. 13. If an anisotropic etching is used, this undercutting does not occur. Either method gives good results. Techniques for etching dielectrics, particularly oxides and/or nitrides, are well-known in the art.

Figure 14:
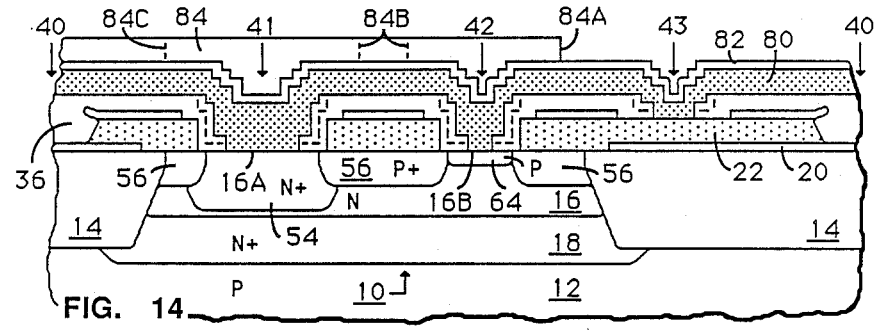

As shown in FIG. 14, fourth conductive polycrystalline layer 80 is then deposited conformally over the structure. For convenience in further processing, masking layer 82 of for example, silicon dioxide, is provided on polycrystalline layer 80. Polycrystalline layer 80 as conveniently formed of polycrystalline silicon with a thickness in the range 250 to 350 nanometers with about 300 nanometers being convenient. However, other conductive semiconductor materials, silicides and intermetallic compounds may also be used to form layer 80. Where polycrystalline silicon is used for both layers 68L and 80, regions 68 remaining from layer 68L merge with and become indistinguishably joined with layer 80.

Figure 15:
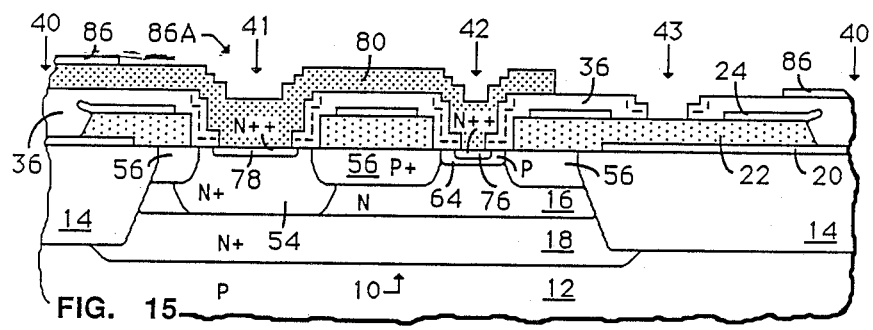
Figure 23:
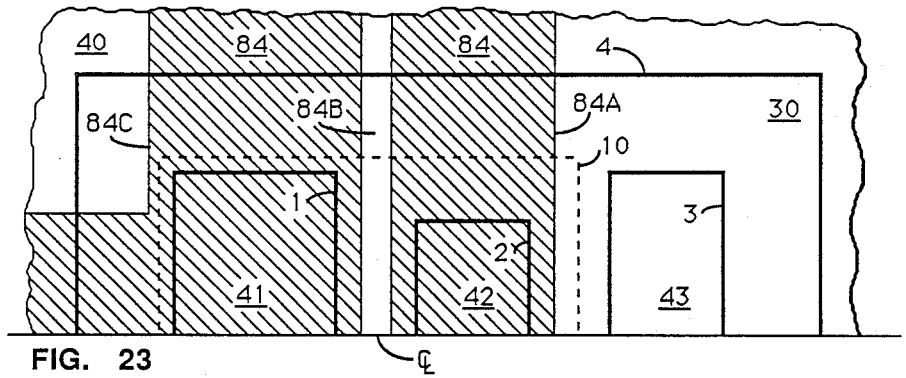

Fifth block-out mask 84 having opening 84A is then applied as shown in FIGS. 14 and 23. The purpose of block-out mask 84 is to allow the portions of layers 82 and 80 in opening 43 in contact with poly layer 22 to be removed. The result is shown in FIG. 15. As is also illustrated in FIGS. 14 and 23, block-out mask 84 may also have openings 84B, 84C when it is desired to remove portions of polycrystalline layer 80 between openings 41, 42 and between openings 41 and 40, as indicated by the dashed lines in FIG. 14 and shown explicitly in FIG. 23. However, these additional openings are optional at this stage of the process.

Following completion of the steps illustrated in FIG. 14, a further diffusion resistant layer 86 of for example silicon nitride, is deposited over the structure and then masked using means well-known in the art to produce opening 86A exposing openings 41, 42, 43 (see FIG. 15). Layer 86 conveniently has a thickness in the range 100 to 200 nanometers with about 150 nanometers being convenient.

It is desired that layer 80 be doped so as to act as a dopant source to form N++ emitter 76 and N++ collector contact enhancement 78. Doping may be provided in layer 80 in a variety of ways, for example, (i) by doping during deposition of layer 80, (ii) by doping after deposition of layer 80 and before removing the portion of layer 80 above opening 43 (see FIG. 14), or (iii) after the removal of the portion above opening 43. It is convenient to dope layer 80 by ion implantation after it is deposited, and to go through the masking step indicated in FIG. 14 before subjecting the deposited doped layer to high temperature operations. This insure that the N++ doping provided in layer 80 does not diffuse into the portion of layer 22 under opening 43.

FIG. 15 illustrates a situation where openings 84B, 84C were not provided in block-out mask 84. Thus, in FIG. 15 emitter 76 and collector contact 78 are still shorted together. For most circuit application it is desirable that they be electrically separated. As is already noted, this may be accomplished at the stage of FIG. 14 or may be accomplished at the stage FIG. 16.

Figure 16:
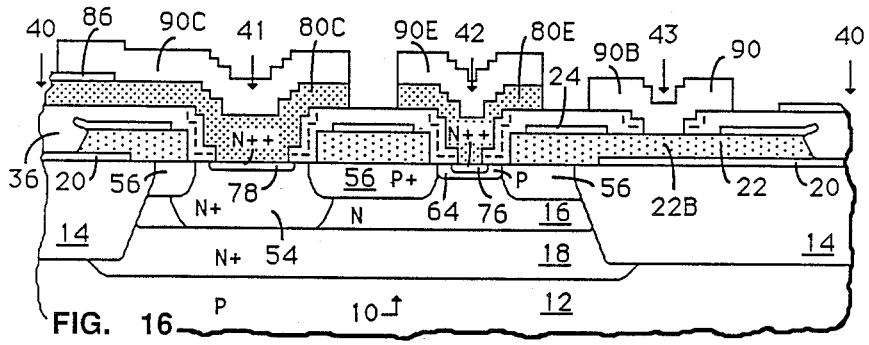

In FIG. 16, conductor layer 90 of metal for example, is deposited over the structure and, using conventional masking techniques well-known in the art, divided into portion 90B in contact with polycrystalline layer 22 in opening 43, into portion 90E in contact with portion 80E of layer 80 in opening 42, and into portion 90C in contact with portion 80C of polycrystalline layer 80 in opening 41. By choosing for conductive layer 90 a material which is differentially etchable with respect to conductive polycrystalline layer 80 and vice-versa, the separated portions 90B, 90E, 90C of layer 90 may be used as a mask to etch apart portions 80C and 80E of layer 80, as shown in FIG. 16. However, this is not essential since portions 80C and 80E may also be separated at the stage of FIG. 23. Aluminum and TiW are examples of differentially etchable conductive materials suitable for use as conductor 90.

The structure of FIG. 16 is analogous to that shown in FIGS. 1–2 and provides a vertical bipolar transistor. Conductors 80E, 90E in opening 42 serve as the emitter electrodes contacting emitter 76. Conductor 90B serves as the base contact. Region 90B contacts polycrystalline conductive layer 22 which extends to extrinsic base region 56 formed therefrom and which is in contact with intrinsic base region 64. Conductors 80C, 90C serve as the collector contact of the device and make contact to enhanced collector contact region 78 which in turn contacts deep collector contact diffusion 54 which in turn contacts buried collector 18 which contacts collector region 16.

As those of skill in the art will appreciate, the structure of FIGS. 1, 2, and 16 is extremely compact. Openings 41, 42, 43 of master mask 30 may have the minimum width and separation achievable with the lithographic process being used. The process sequence narrows openings 41, 42, 43 in a precisely control fashion so that critical lateral dimensions of the device may be made smaller than the available lithographic resolution. Further, the lateral dimensions of the device may be scaled down as the lithographic technology improves, in direct proportion to the achievable metal pitch. These are particular features of the present invention.

Further, tub or island 10 may also be made small since only the collector and emitter contacts need be made to single crystal region 16 in tub 10. Base contact 90B is located on the portion of polycrystalline layer 22 which resides above dielectric isolation 14. This results in decreased collector-substrate capacitance. It will also be apparent to those of skill in the art that alignment between master mask openings 40–43 and tub or island 10 is not particularly critical. It is only essential that openings 41, 42 be entirely contained within tub 10. All of the critical device dimensions are determined by master mask 30 containing openings 40–43. The alignment between master mask 30 and tub 10 and the block-out masks used during fabrication of the device need not be precision alignments. This greatly facilitates manufacturing of high performance devices at high yield.

Figure 17:
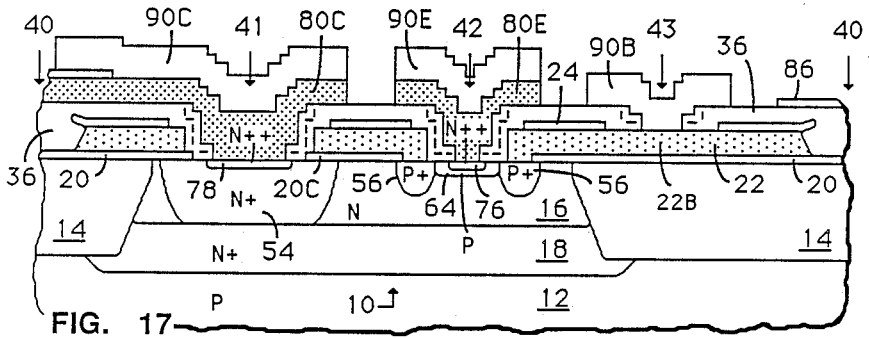
FIG. 17 is a cross-sectional view similar to FIG. 16 but according to a further embodiment of the invention.
Figure 24:
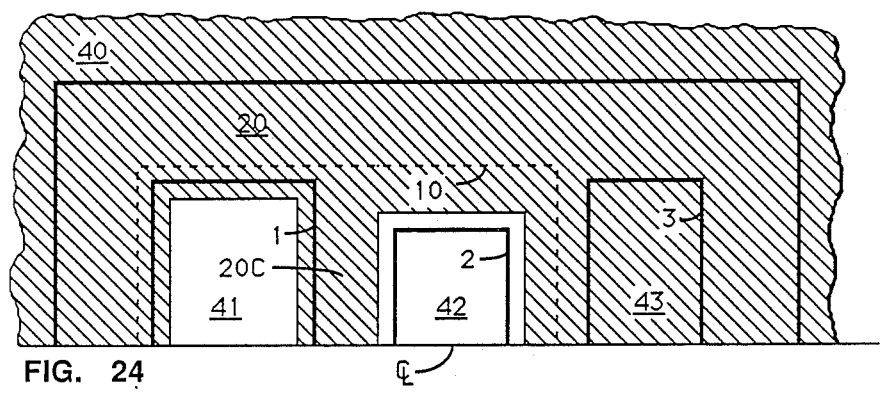

FIGS. 17 and 24 illustrate a further embodiment of the invention wherein portion 20C of under-layer 20 overlaps onto opening 41. This has the effect of preventing the formation of extrinsic base region 56 beneath portion 20C of layer 20. By arranging the mask for defining the openings in layer 20 as shown in FIG. 24, portion 20C prevents direct contact between P+ extrinsic base region 56 and N+ deep collector contact diffusion 54. In this way the breakdown voltage of the device is improved over the configuration of FIG. 16. Also, if desired, a walled-base may be avoided by extending portion 20B of layer 20 onto island 10. This prevents P+ region 56 from intersecting isolation wall 14. This is shown in FIGS. 17 and 24.

It has been found that the devices constructed according to the means and methods described herein have exceptionally high performance. For example, when NPN vertical bipolar transistors are fabricated in silicon having drawn emitter dimensions of approximately 1.5 by 4.0 microns and effective emtter dimensions of about 0.7 by 3.2 microns, they provide cutoff frequency $f_t = 16$ GHz at $I_c = 670$ microamperes/(micro-meter)$^2$ and dc gains of 120. Where the device structure corresponds in cross-section to that shown in FIGS. 1, 16, wherein extrinsic base 56 and deep collector contact 54 touch each other, breakdown voltages $V_{CBO}$ of about 6 volts were obtained. Where regions 56 and 54 are prevented from intersecting, as for example with the arrangement of FIGS. 17 and 24, the $V_{CBO}$ values are higher, i.e., approximately 17 volts.

Further details in connection with the fabrication sequence described in FIGS. 1–24 may be found in copending application by Peter Zdebel et al., entitled "Integrated Circuit Structures Having Polycrystalline Electrode Contacts and Process", Ser. No. 07/009,322, which is incorporated herein by reference.

Having thus described the invention, it will be apparent to those of skill in the art that many variations may be made in materials, detailed fabrication steps, and structural variations without departing from the spirit of the invention. Accordingly it is intended to include all such variations in the claims which follow.

We claim:

1. A method for fabricating a single tub semiconductor device, comprising:
   providing a substrate having a single crystal semiconductor tub laterally enclosed by an isolation region, wherein said tub and said lateral isolation region have an exterior surface;
   covering said exterior surface with an oxidizable conductive first polycrystalline layer having a first thickness;
   covering said first polycrystalline layer with a first oxidation resistant layer;
   covering said oxidation resistant layer with an oxidizable second polycrystalline layer;
   covering said second polycrystalline layer with a masking layer;
   patterning said masking layer and said second polycrystalline layer with a master mask pattern to provide first and second non-overlapping openings above said tub, a third opening above a portion of said lateral isolation region adjacent said tub, and a fourth opening above said lateral isolation region and laterally enclosing said first through third openings, wherein said first through fourth openings overlie respectively first through fourth portions of said first polycrystalline layer and said first oxidation resistant layer, and wherein said first and second openings overlie respectively first and second portions of said tub;
   removing said fourth portion of said first oxidation resistant layer thereby exposing said fourth portion of said first polycrystalline layer;
   converting said fourth portion of said first polycrystalline layer and those portions of said second polycrystalline layer lying between said first through fourth openings to dielectric regions;
   removing at least said first and second portions of said first oxidation resistant layer;

removing said first and second portions of said first polycrystalline layer thereby exposing said first and second portions of said tub and sidewalls of said first polycrystalline layer where said first and second portions of said first polycrystalline layer are removed;

leaving in place a fifth portion of said first polycrystalline layer lying laterally between said first and second openings and said fourth opening, wherein part of said fifth portion of said first polycrystalline layer overlies a third portion of said tub not occupied by said first and second portions of said tub; and then in any order, doping said first portion of said tub to a first depth with a first type dopant, doping said second portion of said tub to a second depth with a second type dopant opposite said first type dopant, and doping at least part of said third portion of said tub to a third depth with another dopant.

2. The method of claim 1 wherein said another dopant is of said second type.

3. The method of claim 1 wherein at least one of said first and second polycrystalline layers comprise silicon.

4. The method of claim 1 further comprising, providing an oxidation resistant dielectric under-layer on said exterior surface of said lateral isolation region around said tub.

5. The method of claim 1 wherein said step of doping said third portion of said tub with another dopant comprises doping said third portion of said tub with a dopant from said first polycrystalline layer.

6. The method of claim 1 wherein said step of doping said third portion of said tub comprises, first doping at least said fifth portion of said first polycrystalline layer during or after the step of covering said surface with said first polycrystalline layer, and then doping said third portion of said tub from said fifth portion of said first polycrystalline layer.

7. The method of claim 1 further comprising:
forming a dielectric on said first and second portions of said tub and said sidewalls;
forming a conductive third polycrystalline layer on said dielectric on said sidewalls;
removing said dielectric centrally from said first and second portions of said tub;
forming a conductive fourth polycrystalline layer above said substrate and in contact with said third polycrystalline layer and said first and second portions of said tub:
removing part of said fourth polycrystalline layer to provide at least two electrically isolated portions thereof, one portion in contact with said first portion of said tub and a second portion in contact with said second portion of said tub; and
further doping said first and second portions of said substrate.

8. The method of claim 1 wherein the covering steps comprise covering the exterior surface with a first polycrystalline layer of the first thickness, covering the first polycrystalline layer with a first oxidation resistant layer of a second thickness, and covering the first oxidation resistant layer with a second polycrystalline layer of a third thickness, and wherein the first thickness is in the range 370–400 nanometers, the second thickness is in the range 90–110 nanometers, and the third thickness is in the range 160–200 nanometers.

9. The method of claim 1, wherein the covering steps comprise forming the first polycrystalline layer to a first thickness, forming the first oxidation resistant layer to a second thickness and forming the second polycrystalline layer to a third thickness, and wherein the dielectric formed from the converted portions of the first polycrystalline layer has a fourth thickness and the dielectric formed from the converted portions of the second polycrystalline layer has a fifth thickness, and wherein the fourth thickness substantially equals the sum of the first, second and fifth thicknesses.

10. The method of claim 1 wherein the steps of forming the first polycrystalline layer to the first thickness comprises forming a first polysilicon layer to the first thickness, the step of forming the first oxidation resistant layer comprises forming a layer comprising silicon nitride to a second thickness, the step of forming a second polycrystalline layer comprises forming a second polysilicon layer to a third thickness, and wherein the step of converting portions of the first and second polycrystalline layers comprises converting portions of the first and second polysilicon layers to silicon oxide of fourth and fifth thickness, respectively, and wherein the fourth thickness substantially equals the sum of the first, second and fifth thicknesses.

11. The method of claim 4 wherein said dielectric under-layer comprises a silicon nitride layer.

12. The method of claim 4 wherein said dielectric under-layer has a further portion over said tub located between said first and second openings.

13. The method of claim 4 wherein said dielectric under-layer has a portion partly located on said tub and surrounding said first opening.

14. The method of claim 7 wherein said step of further doping said first and second portions of said substrate comprises doping from said fourth polycrystalline layer with a dopant of said first type.

15. The method of claim 7 wherein at least one of said third and fourth polycrystalline layers comprise silicon.

16. The method of claim 10 wherein the converting step comprises thermal oxidation.

17. The method of claim 11 wherein said under-layer further comprises a silicon oxide layer beneath said silicon nitride layer.

* * * * *